(12) United States Patent
Kumar et al.

(10) Patent No.: US 6,897,155 B2
(45) Date of Patent: May 24, 2005

(54) METHOD FOR ETCHING HIGH-ASPECT-RATIO FEATURES

(75) Inventors: Ajay Kumar, Sunnyvale, CA (US);
Anisul H. Khan, Santa Clara, CA (US);
Dragan Podlesnik, Palo Alto, CA (US);
Sharma V. Pamarthy, Hayward, CA (US); Axel Henke, Dresden (DE);
Stephan Wege, Dresden (DE);
Virinder Grewal, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 273 days.

(21) Appl. No.: 10/219,885

(22) Filed: Aug. 14, 2002

(65) Prior Publication Data

US 2004/0033697 A1 Feb. 19, 2004

(51) Int. Cl.$^7$ .............................................. H01L 21/302
(52) U.S. Cl. ....................................... 438/706; 438/714
(58) Field of Search .................................. 438/706, 710, 438/714, 719, 720, 723, 724

(56) References Cited

U.S. PATENT DOCUMENTS

| | | | | |
|---|---|---|---|---|
| 5,512,130 A | * | 4/1996 | Barna et al. ................. | 438/714 |
| 5,801,101 A | * | 9/1998 | Miyoshi ...................... | 438/714 |
| 6,242,350 B1 | * | 6/2001 | Tao et al. .................... | 438/690 |
| 6,274,500 B1 | * | 8/2001 | Xuechun et al. ............ | 438/706 |
| 6,328,905 B1 | * | 12/2001 | Lebowitz et al. ............. | 216/67 |
| 6,479,395 B1 | * | 11/2002 | Smith et al. ................. | 438/723 |

OTHER PUBLICATIONS

Armacost, M. et al., Plasma–etching process for ULSI semiconductor circuits, www.research.ibm.com/journal/rd/431/armacost.htlm, last visited Nov. 2, 2001.

Bhardwaj, J. et al., Dry Silicon Etching for Mems, Surface Technology Systems Limited, 1997.

Dobkin, Daniel M., Effects of Operating Parameters on Capacitive Plasmas, www.batnet.com/enigmatics/semi-colon...Fundamentals/plasma/Cap_parameters.html, last visited Nov. 6, 2001.

Rowlette et al., High–Resolution Dry Etching of Si–Based Dielectrics Using a Chemically Amplified Electron–Beam Resist, National Nanofabrication Users Network, Research Experience for Undergraduates Program, pp. 49–50.

Williams et al., Characterization of the Aspect Ratio Dependant Etch for Micro–Electromechanical Systems, National Nanofabrication Users Network, Stanford Nanofabrication Facility, pp. 76–77.

Wise et al., Observations of Pattern–Dependent Plasma Charging and Polymer Deposition During Deep Trench Dyr Etch, Future Fab International, www.future–fab.com/documents.asp?d_ID=647, last visited Oct. 24, 2001.

* cited by examiner

Primary Examiner—Kin-Chan Chen
(74) Attorney, Agent, or Firm—Moser, Patterson & Sheridan, LLP; Joseph Bach (57) ABSTRACT

A method for operating a plasma reactor to etch high-aspect-ratio features on a workpiece in a vacuum chamber. The method comprises the performance of an etch process followed by a flash process. During the etch process, a first gas is supplied into the vacuum chamber, and a plasma of the first gas is maintained for a first period of time. The plasma of the first gas comprises etchant and passivant species. During the flash process, a second gas comprising a deposit removal gas is supplied into the vacuum chamber, and a plasma of the second gas is maintained for a second period of time. The DC voltage between the workpiece and the plasma of the second gas during the second period of time is significantly less than the DC voltage between the workpiece and the plasma of the first gas during the first period of time.

19 Claims, 9 Drawing Sheets

METHOD FOR ETCHING HIGH-ASPECT-RATIO FEATURES

The present application relates to semiconductor processing technologies, and particularly to a method of etching high-aspect-ratio features in semiconductor devices.

BACKGROUND OF THE INVENTION

The demand for faster, more powerful integrated circuit (IC) devices has introduced new challenges for IC fabrication technology, including the need to etch high-aspect-ratio features, such as trenches or vias, on a substrate or wafer. For example, deep-trench storage node capacitors used in some dynamic random access memory structures require high-aspect ratio trenches in silicon. Deep silicon trench etching is typically carried out in a reactive ion etching (RIE) process with a $SiO_2$ hard mask. The challenges in trench etching include achieving a high etching rate even for ultrahigh-aspect-ratio features and controlling trench sidewall taper angles to very tight limits.

Typically, a deep silicon trench etch process is performed in a bromine-containing plasma, which is a plasma of a combination of gases including a bromine-based compound, such as HBr, as an etchant gas for removing exposed silicon from the wafer. The combination of gases also includes a passivant gas such as $O_2$ for protecting the trench sidewalls from the etchant gas. The $O_2$, together with Si-containing etching products, forms a passivation layer deposited on the sidewalls of the trenches. To prevent this layer from becoming too thick, a deposit removal gas such as $NF_3$ is typically included in the combination of gases used for Si trench etching. The amount of deposits on the trench sidewalls and the taper angles can usually be controlled by adjusting the wafer surface temperature and the $O_2$ partial pressure in the $HBr/NF_3/O_2$ plasma.

Figure 1:
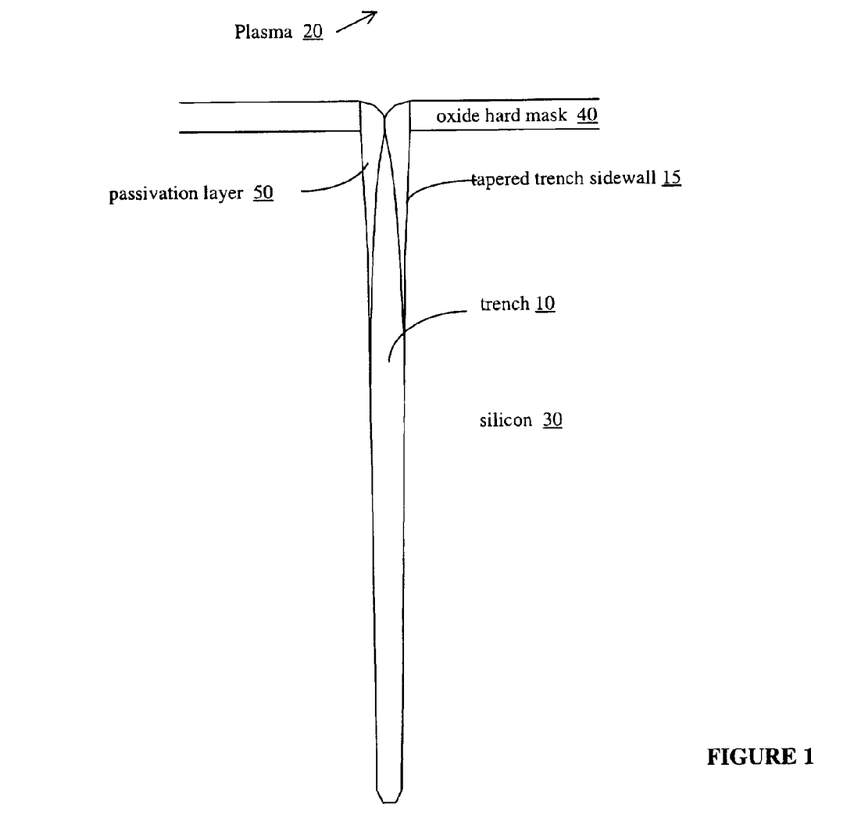
FIG. 1 is a cross section of a high-aspect-ratio silicon trench etched using a prior art deep silicon trench etching process where choking is found to prevent the silicon trench from being etched deeper.

However, as feature sizes continue to shrink, the deposits on the trench sidewalls may close up or choke the trench openings and prevent the trenches from being etched deeper. For example, FIG. 1 depicts a trench 10 with tapered trench sidewalls 15 being etched by a plasma 20 in a silicon wafer 30. An oxide hard mask 40 on top of silicon wafer 30 protects the silicon from being etched except in the area of trench 10. As the etching proceeds, a passivation layer 50 builds up on the sidewalls of the trench and may choke the trench opening as shown in FIG. 1. Choking is known as one of the factors limiting the aspect ratio of trenches that can be etched with an RIE process. Increasing the $NF_3$ partial pressure may help reduce choking in some situations, but having a large amount of $NF_3$ in the RIE process may result in excessive erosion of the $SiO_2$ mask. Therefore, it is desirable to have an etching process that eliminates the problem of choking while maintaining precise control of the trench sidewall taper angles and other critical features associated with deep silicon trenches having very small critical dimensions.

Moreover, as the layer of deposits forms on the trench sidewalls, it also forms on other surfaces inside an etching chamber. Typically, a chamber for deep silicon trench etching needs to be cleaned after a certain number of wafers are etched. The cleaning is conventionally done using a dry clean process such as, for example, by running a $NF_3$ plasma for 1.5 minutes for every 10 minutes of etching done in the chamber. In order to protect the surface of a wafer holder in the chamber during the dry clean process, a test wafer is usually placed on the wafer holder. The dry clean process itself and the transferring of wafers in and out of the chamber are time consuming, and thus slow down the throughput of wafer production. Also, the test wafer can only be used for a certain number of dry clean processes and is costly to replace. Therefore, it is desirable to maintain a clean chamber during an etching process or to clean the chamber quickly afterwards without the use of a test wafer.

Furthermore, using a bromine-containing plasma to etch deep silicon trenches typically results in a large amount of bromine condensation on the $SiO_2$ mask. When the etching is completed, the wafer is typically removed from an etching chamber to a transfer chamber through a load lock. The bromine condensation on the $SiO_2$ mask tends to evaporate from the $SiO_2$ mask during this process and re-deposit on other surfaces on the load lock and in the transfer chamber, causing corrosion in the transfer chamber and on the load lock after transfer of a number of processed wafers.

SUMMARY OF THE INVENTION

In summary, the present invention includes a method for operating a plasma reactor to etch high-aspect-ratio features on a workpiece or wafer. The plasma reactor is configured to allow radio frequency (RF) or microwave power to be coupled into the vacuum chamber from at least two power supplies. The workpiece is covered with a mask layer having openings to allow the etching of the high-aspect-ratio features. The method comprises the performance of an etch process followed by a flash process. During the etch process, a first gas is supplied into the chamber, and a plasma of the first gas is maintained for a first period of time. The plasma of the first gas comprises etchant and passivant species; and the plasma is maintained by coupling power into the vacuum chamber from one or more of the power supplies. The etch process etches the workpiece by advancing the depth of the high-aspect-ratio features while depositing a passivation layer on the sidewall of the features. During the flash process, a second gas comprising a deposit removal gas is supplied into the chamber, and a plasma of the second gas is maintained for a second period of time. The plasma of the second gas comprises deposit removal species; and, again, the plasma is maintained by coupling power into the vacuum chamber from one or more of the power supplies. The relative amount of power coupled into the chamber from the power supplies is apportioned such that the DC voltage between the plasma and the wafer is not significant. As a result, the mask layer on the workpiece is not subject to both the energetic ion bombardment and the deposit removal species at the same time. Therefore, the flash process strips off a portion of the passivation layer without damaging the mask layer with ion assisted chemical reactions. The etch process followed by the flash process may be repeatedly performed to achieve desired depth of the high-aspect-ratio features. The flash process can also be employed to clean off bromine condensations on the mask layer and/or to clean off deposits on other surfaces inside the chamber after etching the high-aspect-ratio features using a bromine-containing plasma.

In one embodiment of the present invention, the durations of the etch and flash processes and the transition between these processes are controlled by a processor having access to a storage device. The storage device includes a computer readable medium storing therein computer executable program instructions that when executed cause the reactor to perform the etch and flash processes for predetermined durations of time and to switch between these processes at predetermined moments of time during the etching of high-aspect-ratio features.

In one embodiment of the present invention, the power supplies include a first RF power source that is connected, through a first impedance match network, across the bottom electrode at a bottom of the chamber and a counter electrode at a ceiling or wall of the chamber. The power supplies further include a second RF power source connected to a coil antenna through a second impedance match network, the coil antenna being over the ceiling or around a wall of the vacuum chamber.

In an alternative embodiment of the present invention, the power supplies include a bottom RF power source that is connected, through a bottom impedance match network, across the bottom electrode at the bottom of the vacuum chamber and a top electrode at the ceiling of the vacuum chamber. The power supplies further include a top RF power source connected across the top electrode and the bottom electrode through a top impedance match network. The RF frequency of the top RF power source is significantly higher than the RF frequency of the bottom RF power source. The top impedance match network is configured to ground the top electrode for the RF power from the bottom RF power source while appearing to have high impedance for the RF power from the top RF power source. The bottom impedance match network is configured to ground the bottom electrode for the RF power from the top RF power source while appearing to have high impedance for the RF power from the bottom RF power source.

BRIEF DESCRIPTION OF THE DRAWINGS

Additional objects and features of the invention will be more readily apparent from the following detailed description and appended claims when taken in conjunction with the drawings, in which:

DESCRIPTION OF ILLUSTRATIVE EMBODIMENTS

The present invention includes a method for operating a plasma reactor to etch high-aspect-ratio features on a sample or workpiece, such as a semiconductor wafer. The method can be performed in most plasma reactors having more than one power supply, such as inductively coupled plasma (ICP) reactors, electron-cyclotron reactors (ECR) (or downstream microwave reactors), triode reactors, dual powered magnetically enhanced reactive ion etching reactors, and the like. In any of these reactors, there are at least two power supplies that can be operated simultaneously or sequentially to ignite and maintain a plasma in a vacuum chamber. The power supplies are independently controllable such that the relative amount of power coupled into the vacuum chamber from the power supplies may be adjusted as desired.

Figure 2A:
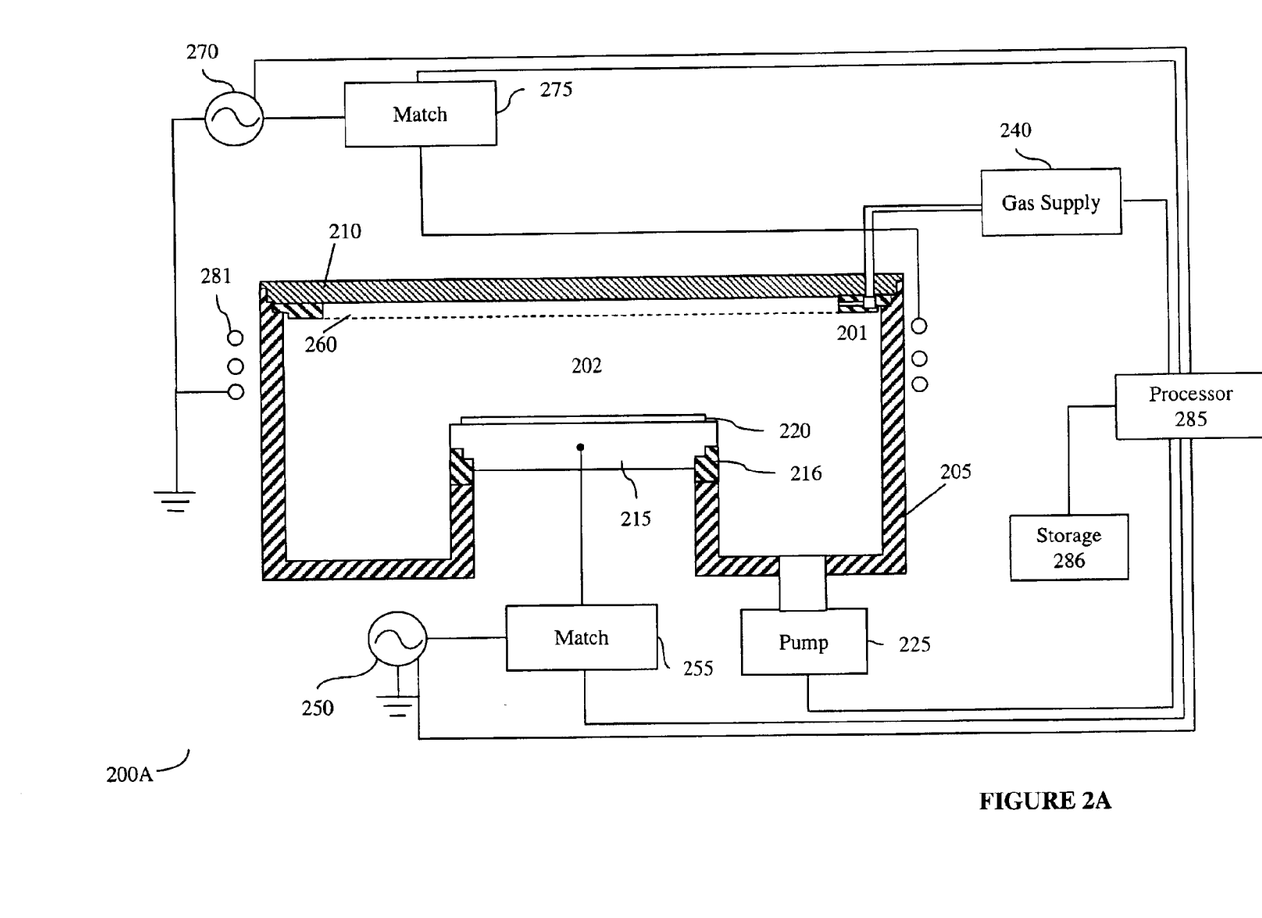
FIG. 2A is a block diagram of a reactor that can be used to etch high-aspect-ratio features according to one embodiment of the present invention.
Figure 2B:
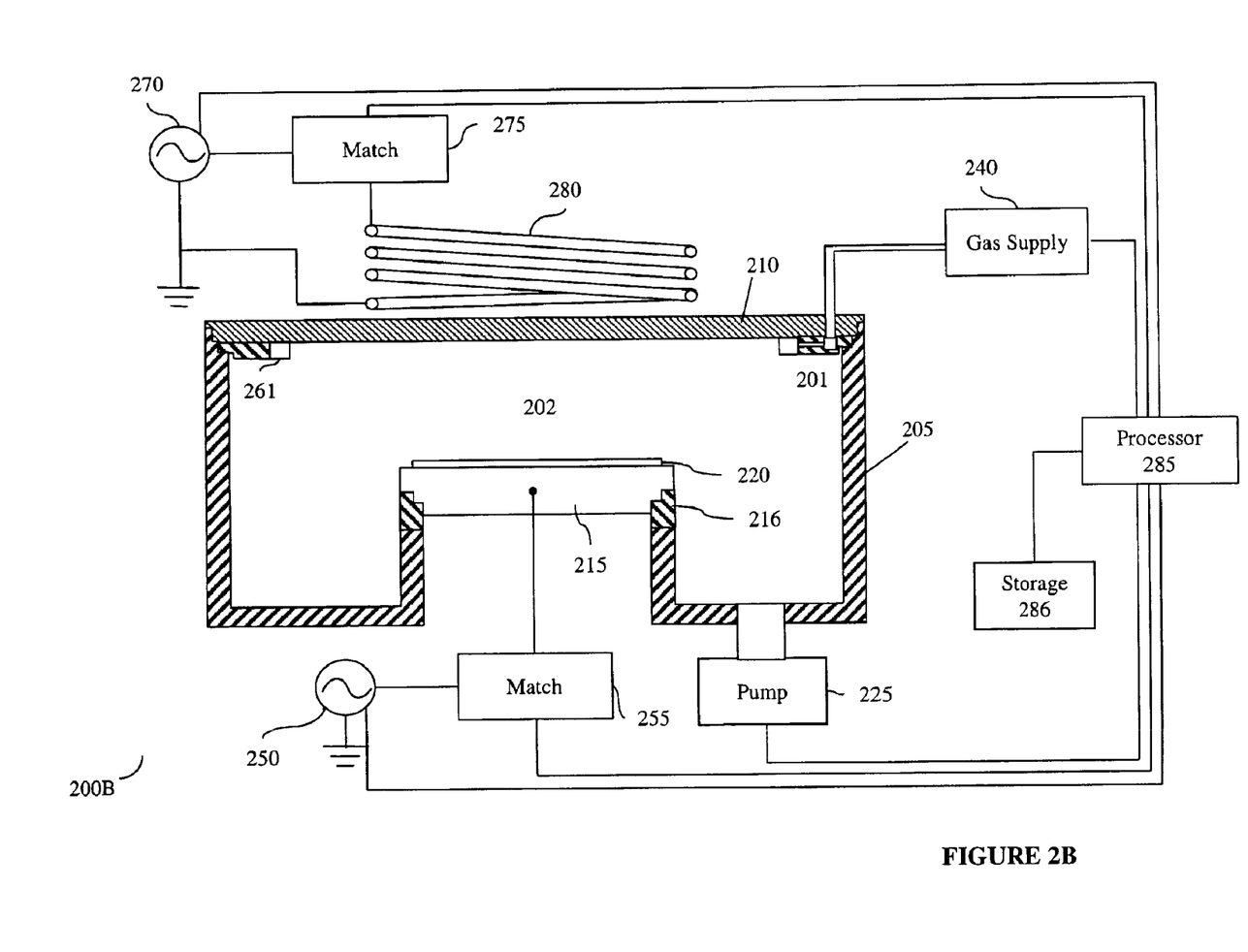
FIG. 2B is a block diagram of a reactor that can be used to etch high-aspect-ratio features according to an alternative embodiment of the present invention.
Figure 2C:
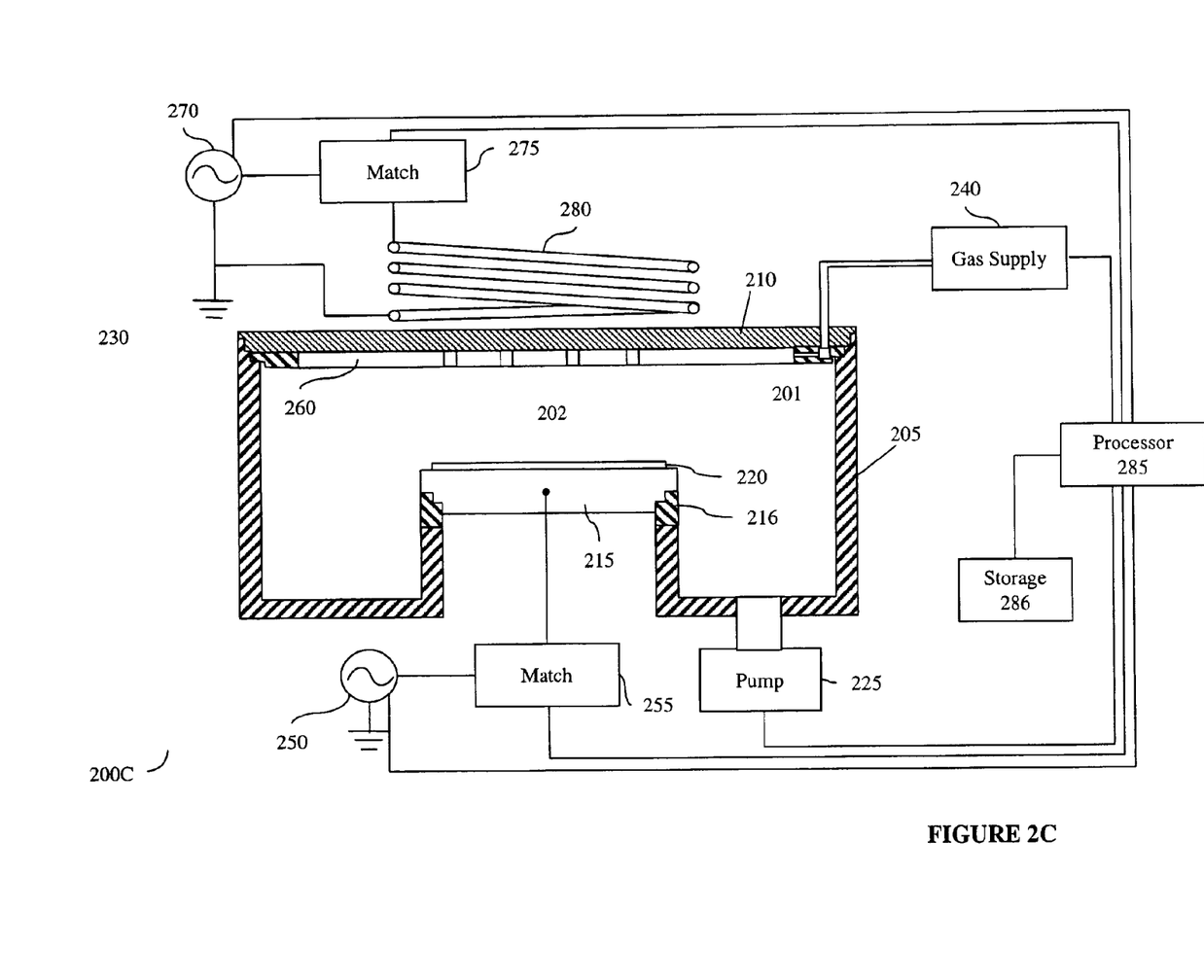
FIG. 2C is a block diagram of a reactor that can be used to etch high-aspect-ratio features according to another alternative embodiment of the present invention.
Figure 2D:
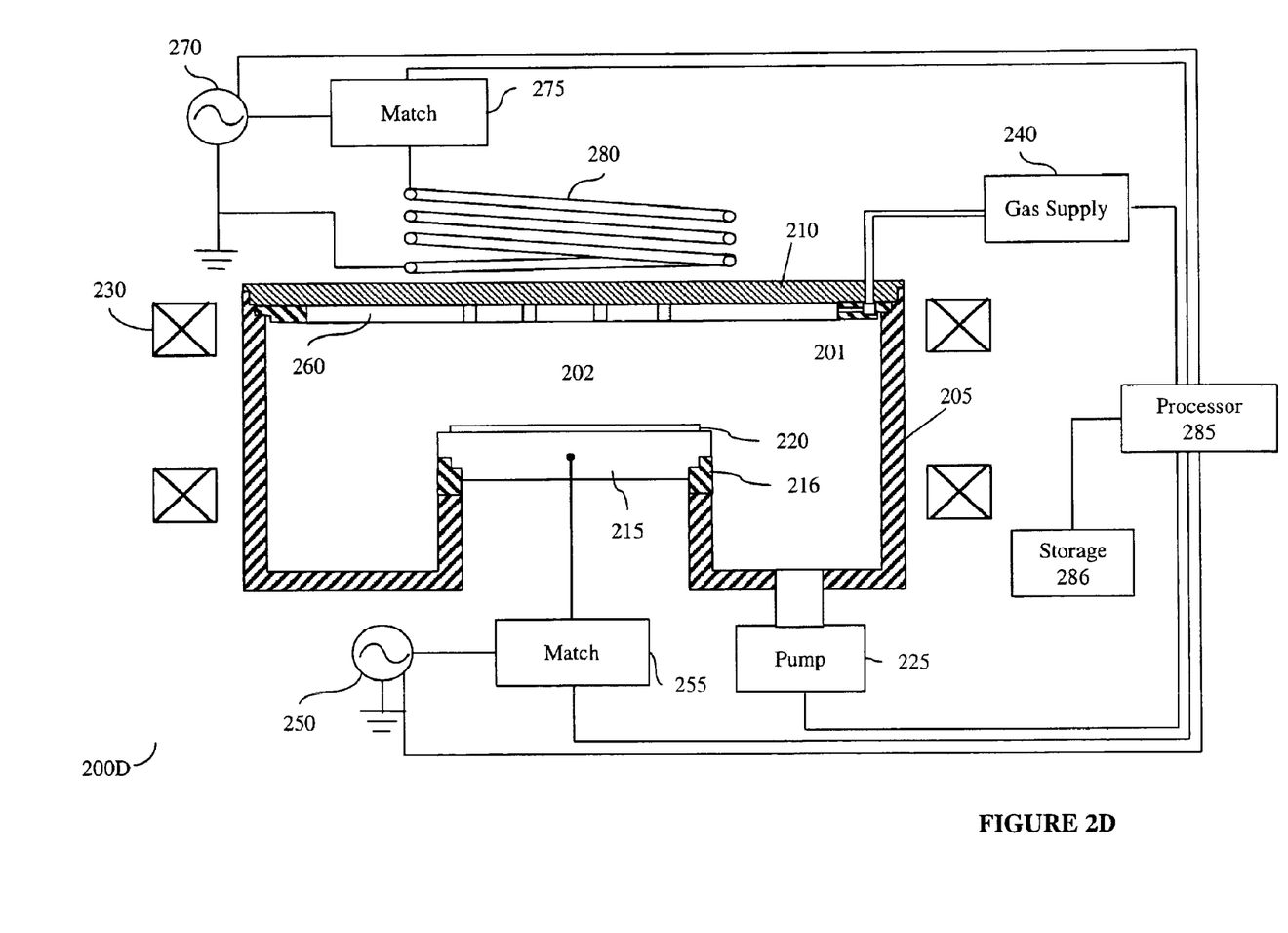
FIG. 2D is a block diagram of a reactor that can be used to etch high-aspect-ratio features according to another alternative embodiment of the present invention.

FIGS. 2A–D illustrate a set of reactors 200A, 200B, 200C, and 200D, respectively, that can be used to etch high-aspect-ratio features according to several embodiments of the present invention. For ease of description, similar elements in each of the reactors 200A, 200B, 200C, and 200D will be referred to with the same reference numerals hereafter. Referring to FIGS. 2A–D, each reactor includes a vacuum chamber 201 enclosed by a cylindrical wall 205 and a ceiling 210. A wafer support pedestal 215 lies at the bottom of the vacuum chamber 201 and supports a semiconductor wafer or workpiece 220. The wafer support pedestal 215 may be insulated from the chamber wall 205 by an insulator ring 216. A vacuum pump 225 maintains a vacuum within the vacuum chamber 201. Process gases are introduced into the vacuum chamber 210 from a process gas supply 240. In some embodiments of the present invention, a gas distribution plate (GDP) 260 coupled to the process supply 240 provides a uniform gas distribution over the top of the wafer support pedestal 215 (FIGS. 2A, 2C and 2D). In another embodiment, a gas distribution ring 261 coupled to the process supply 240 provides a uniform gas distribution around the wafer support pedestal 215 (FIG. 2B).

In each embodiment of the present invention, one power supply is a radio frequency (RF) power source coupled to the vacuum chamber through capacitive coupling. As illustrated in FIGS. 2A–D, RF power from a first (or bottom) RF power source 250 is applied through a first match network 255 across two electrodes, one of which is typically the wafer support pedestal 215 at the bottom of the vacuum chamber 201. The other electrode, or the counter electrode, can be a top electrode facing the wafer support pedestal or a side electrode at the wall 205 of the vacuum chamber. In one embodiment of the present invention, as illustrated in FIG. 2B, the counter electrode is the wall 205. In alternative embodiments, as illustrated in FIGS. 2A, 2C, and 2D, the counter electrode is the GDP 260.

When the chamber 201 is supplied with a flow of a process gas through the GDP 260 and the pressure in the chamber 201 is maintained at a desired level, the RF power 250 can be turned on to strike a plasma in a process zone 202 in the chamber 201. The plasma typically includes electrons, ions (mostly positive ions), and dissociated neutral chemical species from a gas or a mixture of gases. The plasma density is typically defined as the number of ions per unit volume. The capacitively coupled RF power tends to maintain a plasma with moderate plasma density without dissociating plasma species to a great extent. Also, because the counter electrode 260 and/or 205 typically has a much larger area than the pedestal, the capacitive coupling often causes the pedestal 215 to be at a significant negative DC electrical potential (bias potential) with respect to the ground. As a result, a significant DC electrical potential difference (or DC voltage) exists between the plasma and the wafer 220, and most of this DC voltage appears across a thin sheath region near the wafer 220. The positive ions coming from the plasma are accelerated in the sheath region, and typically impinge on the wafer 220 with a significant amount of energy and directionality. The energetic and directional ions are more likely to hit the bottom surface of the feature being etched than the sidewalls, resulting in anisotropic etching.

The capacitive coupling in the reactors shown in FIGS. 2A–D is limited, however, in that it cannot increase the plasma density without at the same time increasing the bias potential of the pedestal or the energies of the ions impinging on the wafer. If these values are too high, the ions can severely damage the mask before completion of the etching process. Plasma density can be improved, using electron-cyclotron resonance or magnetically enhanced reactors, such as reactor 200D shown in FIG. 2D. Reactor 200D further comprises a set of magnets 230 surrounding the vacuum chamber 201 for creating a slowly rotating magnetic field in the chamber 201. For this purpose, the magnets may be electromagnets driven with respective phases of a low frequency (e.g., 0.1–0.5 Hertz) AC current source (not shown). Alternatively, the magnets may be permanent magnets mounted on a slowly rotating support structure (not shown) rotating at, for example, 0.1–0.5 revolutions per second.

The plasma density can also be improved, by the addition of a second power supply. In each embodiment of the present invention, the second power supply is a second (or top) RF power source 270 coupled into the vacuum chamber 201 through inductive coupling. As illustrated in FIGS. 2A–D, the RF power from the second RF power source is applied through a second match network 275 to a coil (or coil antenna) 280 over a top of the chamber 201 (FIGS. 2B–D) or to a coil 281 around the sidewall 205 of the chamber 201 (FIG. 2A).

The RF power applied to the coil, when inductively coupled into the vacuum chamber, tends to maintain plasma density at a relatively high level, and therefore supports a rapid etch rate. The ion density of a plasma generated by inductively coupled RF power is typically in the order of $10^{11}$–$10^{13}$ cm$^{-3}$, while the ion density of a plasma generated by capacitively coupled RF power is typically in the order of $10^9$ cm$^{-3}$. The inductively coupled RF power also tends to dissociate gas species into simpler and more reactive chemical species, making it harder to control other aspects of the etch process such as the profiles of the etched features and etch selectivity to the mask material. Furthermore, the inductively coupled RF power by itself typically does not cause the pedestal 215 or the wafer 220 to be significantly biased with respect to the plasma; and the potential difference between the plasma and the wafer 220 is also much less sensitive to a change in the inductively coupled RF power than to a change in the capacitively coupled RF power. Therefore, the availability of both inductive coupling and capacitive coupling adds an additional degree of flexibility to the design of an etching process. The frequencies of the RF power sources 250 and 270 may be from 50 kHz to 150 MHz. In one embodiment of the present invention, the frequency of the bottom RF power source 250 is 13.6 MHz, and the frequency of the top RF power source 270 is also 13.6 MHz.

Figure 2E:
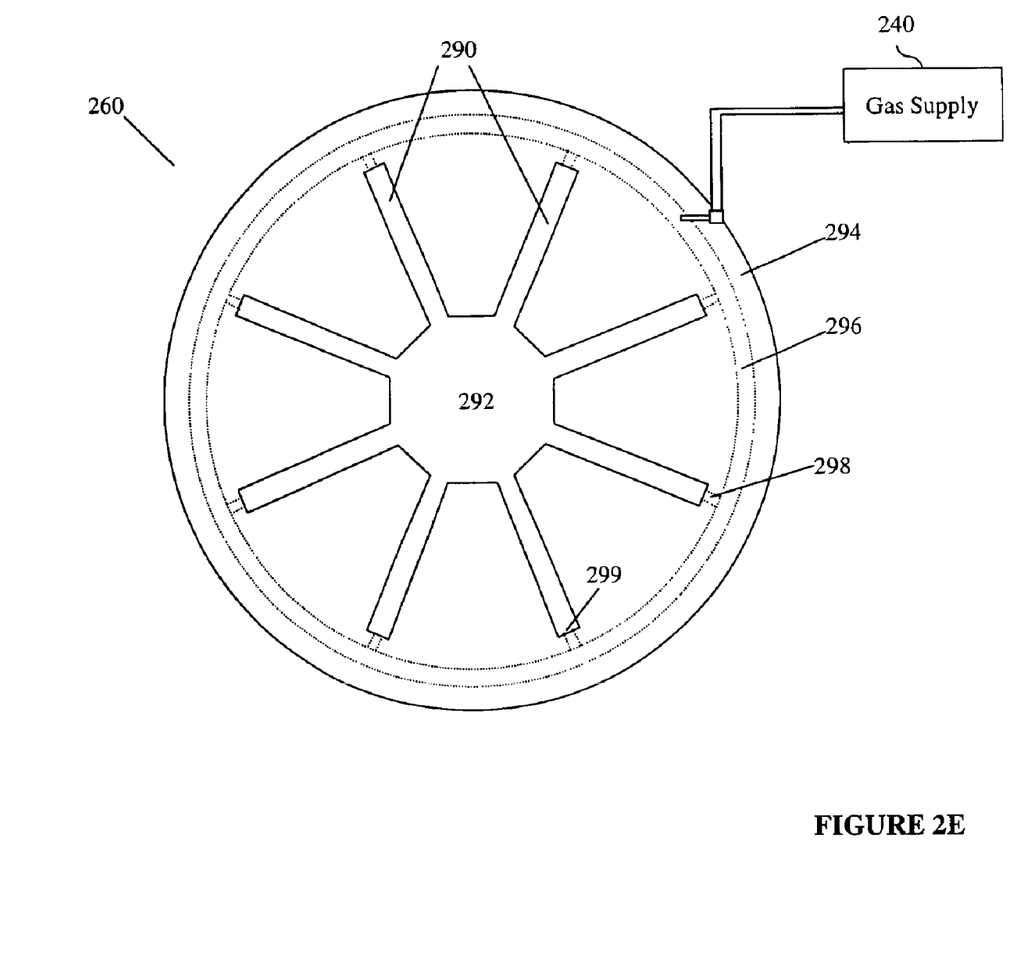
FIG. 2E is a block diagram of a gas distribution plate for the reactor in FIG. 2C or 2D.

For reactors 200C and 200D, shown in FIGS. 2C and 2D, respectively, there is a possiblity that the conductive counter electrode 260 will shield the vacuum chamber 201 from the coil antenna 280 placed over the counter electrode 260, and therefore prevent inductive coupling from the coil antenna 280 into the vacuum chamber. To avoid this shielding effect, the counter electrode 260 in FIGS. 2C or 2D has a number of apertures or voids 290 shown in FIGS. 2C and 2D cut into it. As best shown in the top view of FIG. 2E, the apertures or voids 290 extend radially outwardly from a central aperture 292 to an outer annulus 294 of the counter electrode. The radially extending apertures 290 block clockwise or counterclockwise current flow around the disk-shaped counter electrode 260. Therefore, they prevent the formation of eddy currents induced by the coil antenna 280 that would otherwise absorb the power applied by the antenna 280 before it reaches the vacuum chamber 201. With the radially extending apertures 290, the counter electrode 260 is practically transparent to the inductive coil antenna 280 and yet has sufficient area to provide a fairly uniform ground plane or return potential for the RF power applied to the wafer support pedestal 215. This is because the radial apertures 290 are narrow compared to the area of the counter electrode 260. For example, the apertures 290 may be sufficiently narrow that the total area occupied by all of the apertures 290 is less than 5–10% of the entire area of the counter electrode. In the embodiments of the present invention where the conductive counter electrode 260 is also the GDP, the GDP has a gas distribution manifold and gas injection orifices coupled to the manifold. In accordance with an embodiment of the present invention, the gas distribution manifold is an annular interior channel 296 inside and concentric with the outer annulus 294. The gas injection orifices are radial channels 298 extending radially inwardly from the annular channel 296 and terminating at gas injection holes 299 into radial apertures 290. The process gas supply is coupled to the gas distribution channel 296.

Each of the reactors 200A–D is controlled by a processor 285 having access to a storage device 286. The processor 285 is coupled to the RF power sources 250 and 270, the match networks 255 and 275, pump 225, and the gas supply 240. In the case of the embodiment shown in FIG. 2D, the processor is also coupled to the AC current source driving the magnets 230. The storage device 286 includes a computer readable medium storing therein computer readable program instructions that when executed by the processor 285 can cause the RF power source 250 or 270, and/or the magnetic field in the chamber 201 to turn on or off, and up or down. The processor 285 may also control the tuning of the match network 255 or 275 to allow maximum coupling of the RF power from the RF power source 250 or 270, respectively, into the chamber. The processor 285 may also control the gas supply 240 to adjust the flow rate of a certain gas into the chamber 201 and to switch between different gases, according to the computer readable program instructions.

Figure 4:
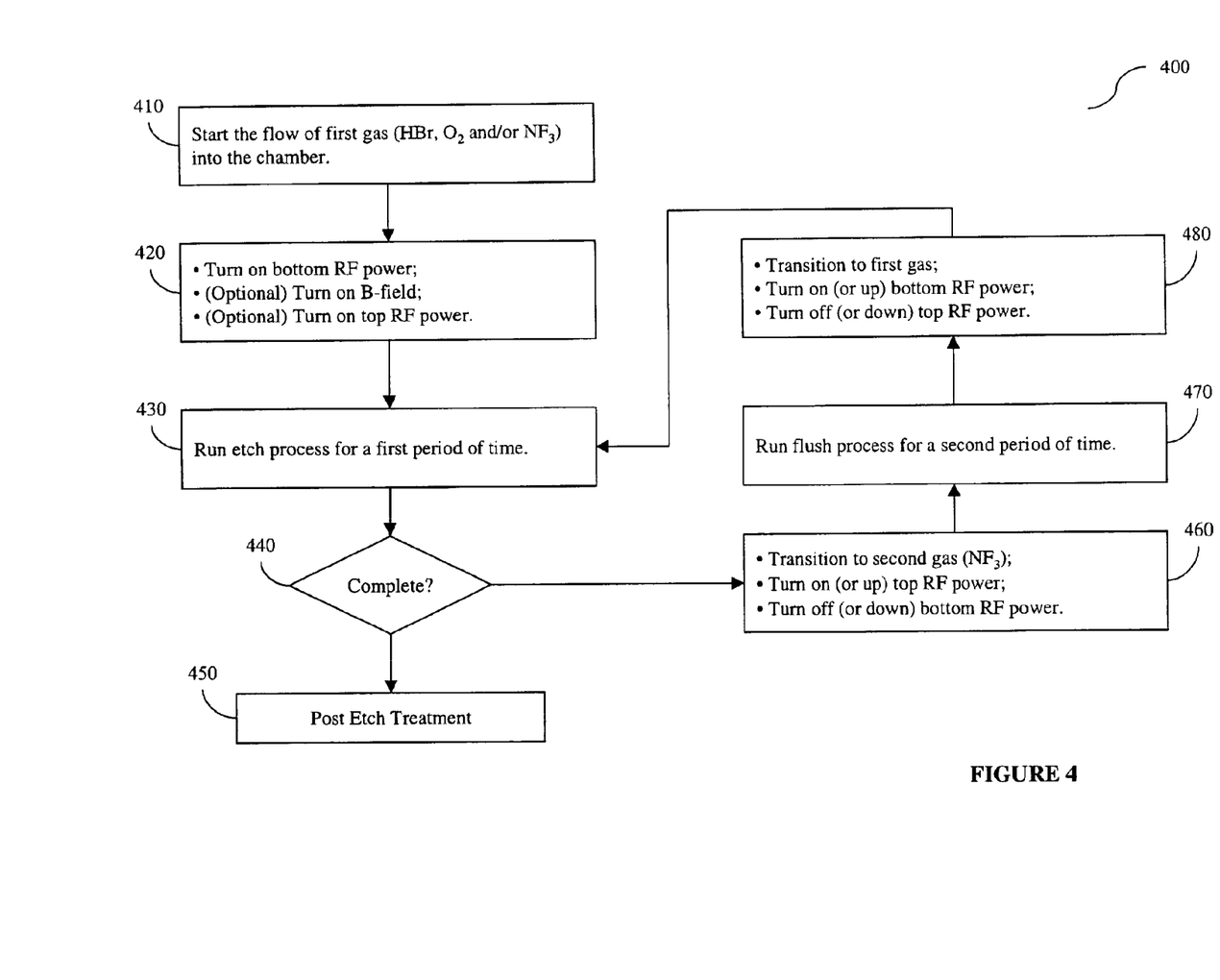
FIG. 4 is a flow chart illustrating a process for etching high-aspect-ratio features according to one embodiment of the present invention.

FIG. 4 illustrates a process 400 for etching high aspect ratio features that can be performed in the reactors of FIGS. 2A–2D according to one embodiment of the present invention. The process 400 starts at step 410 by providing a flow of a first gas into the vacuum chamber 201. In one embodiment of the present invention, the high aspect ratio features are etched in silicon, and the first gas includes an etchant gas, such as HBr, a passivant gas, such as $O_2$ or $He/O_2$ mixture, and a deposit removal gas, such as $NF_3$. Once the gas pressure in the vacuum chamber 201 is stabilized at a predetermined level, a plasma of the first gas is ignited at step 420 by turning on either or both of the RF power sources 250 and 270. In magnetically enhanced reactors, such as reactor 200D, the magnetic field (B-field) is also turned on. One or both of the match networks 255 and 275 may be tuned immediately after to efficiently couple the RF power from one or both of the RF sources 250 and 270 to the plasma in the vacuum chamber 201. At this point, an etch process has started and it is run at step 430 for a first predetermined period of time.

During the etch process, RF power is coupled to the plasma using solely or mainly the capacitive coupling means, i.e., the plasma is maintained solely or mainly by RF power from the bottom RF power source 250. As a result, the pedestal 215 is significantly biased with respect to the ground. In one embodiment of the present invention, during the etch process, the bias potential of the pedestal 215 is greater than 100 V. In an alternative embodiment, it is greater than 300 V. The RF power from the top RF power source 270 is either turned off or controlled at a level such that the plasma density of the plasma is within a desired range, which, in one embodiment, is about $10^{9-1011}$ cm$^{-3}$. By so apportioning the capacitively coupled RF power and the inductively coupled RF power, increased plasma density is achieved without the loss of control over other aspects of the etch process 430.

The etch process advances the depth of the etched features while depositing a passivation layer on the feature sidewalls. For a 200 mm wafer, the gas pressure in the etch process is in the range of 50–350 mT, and in one embodiment, is in the range of 100–260 mT. The RF power from the bottom RF source 250 is in the range of 500–3000 W, and in an exemplary embodiment, is in the range of 1000–2500 W; the RF power from the top RF power source is in the range of 0–1000 W, and in an exemplary embodiment, is in the range of 0–600 W. The absolute values for the HBr, He/O$_2$, and NF$_3$ gas flow rates may vary depending on chamber design and other parameters, but the flow rate ratios are kept at about 5:1:1 for HBr:He/O$_2$:NF$_3$. In one embodiment of the present invention, the flow of HBr is about 100 standard cubic centimeters per minute (sccm), the flow of He/O$_2$ is about 20 sccm, and the flow of NF$_3$ is about 20 sccm. For a 300 mm wafer, the gas pressure in the etch process is in the range of 50–350 mT, and in an exemplary embodiment, is in the range of 100–260 mT. The RF power from the bottom RF source 250 is in the range of 1000–6000 W and in an exemplary embodiment, is in the range of 2000–4500W; the RF power from the top RF power source is in the range of 0–2000 W, and in an exemplary embodiment, is in the range of 0–1200 W. The HBr:He/O$_2$:NF$_3$ flow rate ratios are kept at about 10:1:1. In one embodiment of the present invention, the flow of HBr is about 250 sccm, the flow of He/O$_2$ about 25 sccm, and the flow of NF$_3$ about 25 sccm.

At the end of the first period of time, a decision is made at step 440 whether enough etching has been done to achieve a desired feature depth. Such a decision is typically based on the desired depth of the trenches, the etch rate measured on test wafers using the same etch process, the number of etch processes performed and the length of time in which each etch process is performed. Once a decision is made that enough etching has been done on the wafer, the process moves to a post etch treatment step 450, which will be explained in more detail below. On the other hand, if a decision is made that more etching needs to be done, the process proceeds to switch from the etch process at step 430, through a transition process at step 460, to a flash process at step 470. The purpose of the flash process is to prevent choking by stripping off a portion of the passivation layer that has built up on the etched feature surface during the previous etch process. The flash process also cleans the vacuum chamber 201 by removing deposits formed on other surfaces inside the vacuum chamber.

The transition from the etch process to the flash process occurs at step 460, where a transition from the first gas to a second gas is initiated. In one embodiment of the present invention, the second gas is a deposit removal gas, such as NF$_3$, and the transition is performed by shutting off the flow of HBr and He/O$_2$, and increasing the flow of NF$_3$ to a predetermined flow rate for the flash process, as specified below. At approximately the same time, the RF power from the bottom RF power source 250 is turned down or off while the RF power from the top RF power source 270 is ramped up, so that the flash process is performed using a plasma maintained solely or mainly by the inductively coupled RF power. In an alternative embodiment, during the transition, the plasma created in the etching process of step 430 is completely turned off, the flow of the first gas is completely shut off, the first gas in the chamber 201 is pumped out before the second gas is supplied to the chamber through the gas supply 240, and a flash plasma is ignited using solely or mainly the top RF power source 270.

The flash process is run at step 470 for a second period of time (flash time). For a 200 mm wafer, the gas pressure in the flash process is in the range of 3 mT to 600 mT and in an exemplary embodiment, is in the range of 5–300 mT. The flow of the NF$_3$ gas is in the range of 20 sccm to 200 sccm, and in an exemplary embodiment, is in the range of 30–70 sccm. The RF power from the top RF power source 270 is in the range of 100–3000W and in an exemplary embodiment, is in the range of 100–600W. The RF power from the bottom RF source 250 is in the range of 0–500 W, and in an exemplary embodiment, is in the range of 0–50 W. For a 300 mm wafer, the gas pressure in the flash process is in the range of 3 mT to 300 mT and in an exemplary embodiment, is in the range of 10–30 mT. The flow of the NF$_3$ gas is in the range of 45 sccm to 400 sccm, and in an exemplary embodiment, is in the range of 60–150 sccm. The RF power from the top RF power source 270 is in the range of 225–6000 W and in an exemplary embodiment, is in the range of 225–1200 W. The RF power from the bottom RF source 250 is in the range of 0–1000 W, and in an exemplary embodiment, is in the range of 0–100 W.

The dissociated reactive species in the NF$_3$ plasma typically react with the passivation layer formed on the surface of etched features and/or on other surfaces inside the vacuum chamber 201, and form volatile products that are eventually pumped out of the vacuum chamber. The dissociated species in the NF$_3$ plasma may also have a side effect of reacting with the SiO$_2$ hard mask. The reaction might cause significant damage to the SiO$_2$ hard mask if it were aggravated by energetic ion bombardment. However, by using mainly the inductively coupled RF power during the flash process wherein limited or no RF power is applied to the pedestal, the pedestal is not significantly biased with respect to the ground. Therefore, the SiO$_2$ hard mask is not subject to energetic ion bombardment from the NF$_3$ plasma and is not significantly affected. In one embodiment of the present invention, during the etch process 430, the bias potential of the pedestal 215 is in the range of 0 to 30 V, and in an alternative embodiment, it is in the range of 0 to 15 V. Typically, the bias potential of the pedestal 215 and therefore the DC voltage between the plasma and the wafer is significantly less in the flash process than in the etch process.

At the end of the second period of time, a transition from the flash process to the etch process occurs at step 480, by, for example, simply restarting the flow of HBr and He/O$_2$ and decreasing the flow of NF$_3$. At the same or approximately the same time, the bottom RF power 250 is ramped up while the top RF power 270 is ramped down or off, so that the etch process is performed using solely or mainly capacitively coupled RF power. At the completion of the transition, the etch process again starts and is run at step 430 for a period of time having the same or different length as the first period of time. Steps 430, 440, 460, 470 and 480 can be run repeatedly in process 400 until a decision is made at step 440 that enough etching has been performed, and the process 400 proceeds to the post etch treatment step 450.

A purpose of the post etch treatment step 450 is to remove bromine condensation on the $SiO_2$ hard mask before the wafer is moved out of the vacuum chamber 201 into a transfer chamber. Another purpose of the post etch treatment step 450 is to clean the vacuum chamber 201 by removing deposits formed on surfaces inside the vacuum chamber during the previous etch process. In the post etch treatment step 450, a transition step is used that is similar to step 460 as described above, and a flash process is used that is similar to the flash process 470 as described above.

Figure 5:
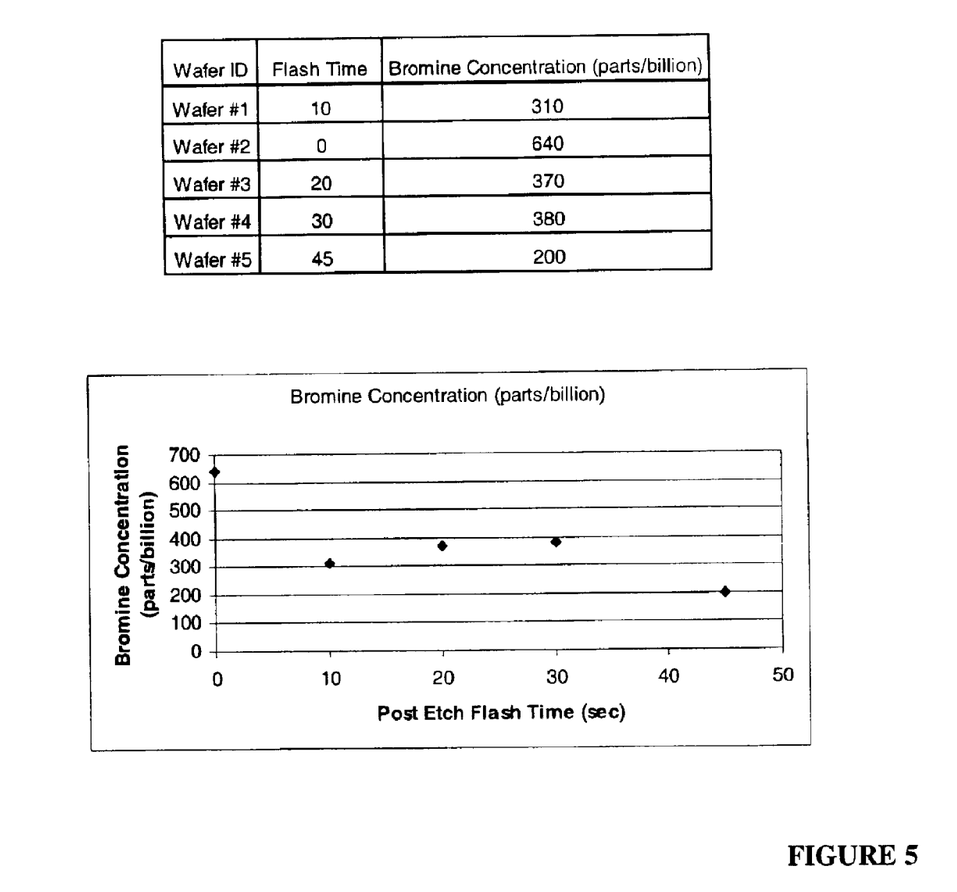
FIG. 5 is a spreadsheet and a corresponding plot of the bromine concentration on the wafer surface as a function of post-etch flash time.

FIG. 5 is a spread sheet and a plot showing the bromine concentration on the wafer surface as a function of post etch flash time. As shown in FIG. 5, a significant reduction in bromine concentration on the wafer surface is achieved by just 10 seconds of flash processing.

When reactor 200D is used, the magnets 230 may be turned on during the etch or flash process to provide a separate control over the plasma density in the chamber 201. The magnetic field in the vacuum chamber 201 in the etch process is in the range of 0–140 G, and in an exemplary embodiment, is in the range of 30–120 G. The magnetic field in the vacuum chamber 201 in the flash process is in the range of 0–30 G, as the magnetic field is less needed in the flash process because of the presence of the significant amount of inductively coupled RF power.

In one embodiment of the present invention, processor 285 controls the performance of process 400 according to a set of computer executable program instructions stored in the computer readable medium in storage device 286. The computer executable program instructions, when executed by processor 285, cause reactor 200 to perform the etch process or the flash process for a predetermined duration of time, to switch between the etch and flash processes at predetermined moments of time during the etching of high-aspect-ratio features, and to perform post etch treatment step 450 at the end of the etching of high-aspect-ratio features, all in accordance with the process 400, as described above.

Therefore process 400 effectively solves the problems of choking, chamber cleaning and bromine condensation. Although process 400 is described above with reference to specific reactor configurations in FIGS. 2A–D, it is not limited to the specific reactor configurations. In practice, process 400 can be performed in plasma reactors having at least two power supplies that can be adjusted so that the bias potential of the pedestal is significantly greater in the etch process than in the flash process.

Figure 3:
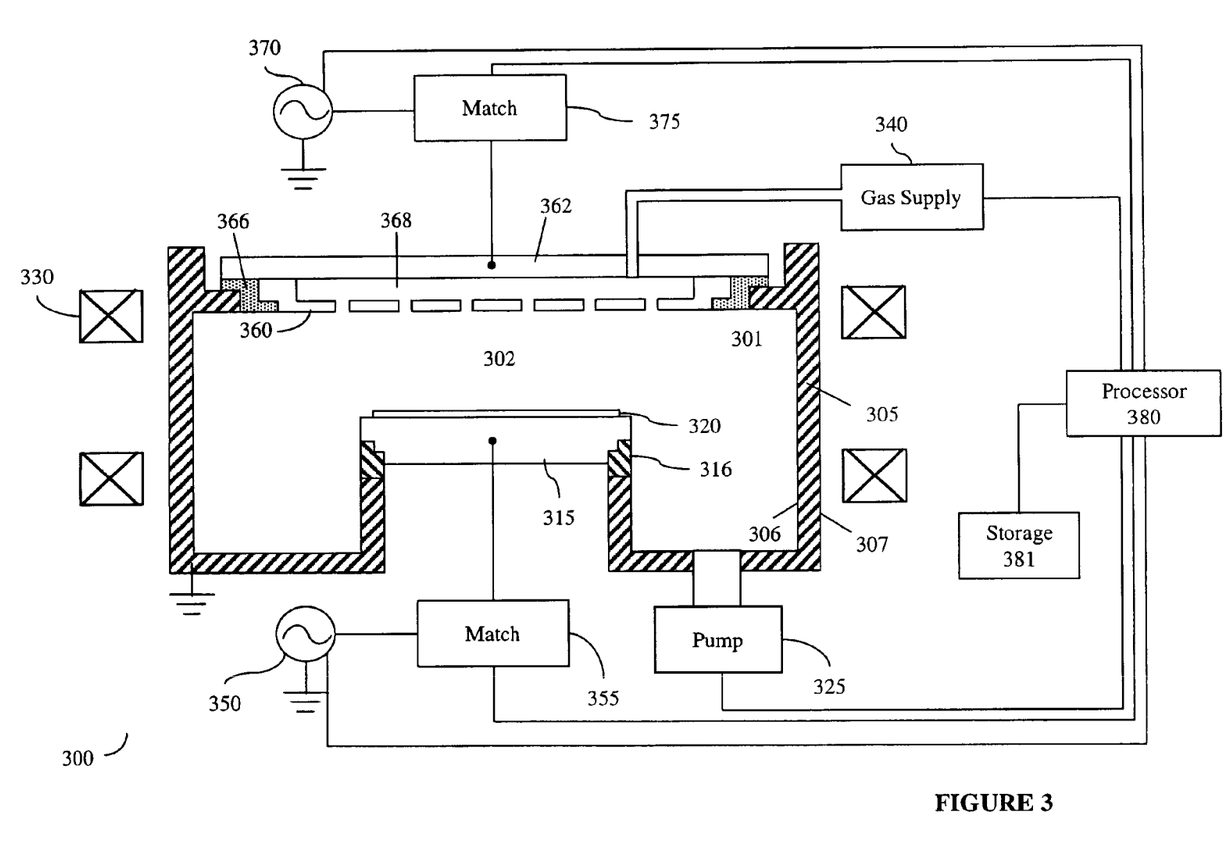
FIG. 3 is a block diagram of a reactor that can be used to etch high-aspect-ratio features according to yet another alternative embodiment of the present invention.

For example, FIG. 3 illustrates a reactor 300 having more than one frequency of excitation of a capacitive plasma, according to another embodiment of the present invention. The reactor 300 includes a vacuum chamber 301 enclosed by a cylindrical wall 305 and a conductive ceiling 362. In one embodiment of the present invention, the wall 305 of the vacuum chamber 301 is made of aluminum and is grounded. An inner surface 306 and outer surface 307 of the wall 305 are anodized to prevent corrosion. A wafer support pedestal or bottom electrode 315 lies at the bottom of the vacuum chamber 301 and supports a semiconductor wafer or workpiece 320. The wafer support pedestal 315 is insulated from the chamber wall 305 by an insulator ring 316. A vacuum pump 325 maintains a vacuum within the vacuum chamber 301. Reactor 300 may optionally include a set of magnets 330 surrounding the vacuum chamber 301 for creating a slowly rotating magnetic field in the chamber 301. For this purpose, the magnets may be electromagnets driven with respective phases of a low frequency (e.g., 0.1–0.5 Hertz) AC current source (not shown). Alternatively, the magnets may be permanent magnets mounted on a slowly rotating support structure (not shown) rotating at, for example, 0.1–0.5 revolutions per second.

The reactor 300 employs two separate RF power supplies, a bottom power supply 350 and a top power supply 370, each connected to a respective one of two electrodes, a bottom electrode 315 which is also the wafer pedestal and a top electrode 360. The bottom electrode is electrically connected to the bottom power supply 350 through a bottom impedance match network 355. The top electrode 360 is in contact with the conductive ceiling 362, which in turn is connected to the top power supply 370 through a top impedance match network 375. In one embodiment of the present invention, the top electrode is also a gas distribution plate (GDP) and has gaps or holes allowing process gas to flow into the chamber 301. For that purpose, a space 368 is provided between the conductive plate 362 and the top electrode 360 to act as a gas distribution manifold coupled to a gas supply 340. A support ring 366 supports the top electrode 360 and provides insulation between the top electrode 360 and the vacuum chamber wall 305.

The bottom and top power supplies 350 and 370 output RF power at two different frequencies that are in the range of 50 kHz to 150 MHz and are substantially different from each other. In one embodiment of the present invention, the frequencies of the bottom and top power supplies 350 and 370 are 13.5 MHz and 60 MHz, respectively. Filtering is employed to minimize the interaction between RF signals from the two RF power supplies 350 and 370. In one embodiment of the present invention, such filtering is accomplished by using an inductor in the match network 375 that grounds the top electrode 260 at 13.6 MHz while appearing to be a high impedance for a 60 MHz signal. Similarly, a capacitor can be used in the match network 355 to ground the lower electrode 350 at 60 MHz while appearing to be a high impedance for a 13.6 MHz signal. Therefore, the reactor 300 has two capacitive coupling means for coupling RF power into a plasma in the vacuum chamber 301. A first or bottom capacitive coupling means includes the bottom power source 350, the bottom electrode 315, and the top electrode 360 together with the grounded chamber wall 305 acting as a grounded counter electrode. The second or top capacitive coupling means includes the top power source 370, the top electrode 360, and the bottom electrode 315 together with the grounded chamber wall 305 acting as a grounded counter electrode.

When the vacuum chamber 301 is supplied with a gas from the gas supply 340 through the GDP 360, and the pressure of the gas in the vacuum chamber is maintained in a certain range (an example of such a range is specified below), a plasma 302 can be generated in the vacuum chamber 301 by using either or both of the two capacitive coupling means. The two RF power sources 350 and 370 can be operated simultaneously or sequentially. Also, the two RF power sources 350 and 370 are independently controllable so that the relative amount of RF power coupled into the vacuum chamber from the top power source 370 and from the bottom power source 350 can be apportioned as desired. To a fair approximation, the high frequency top power source 370 controls the plasma density, due to the more efficient displacement current and sheath heating mechanisms associated with higher RF frequencies. The low frequency excitation from the bottom RF power source 350 controls the energy of the ions bombarding the wafer 320.

Therefore the ion bombardment energy and the plasma density can be separately adjusted in the reactor 300 just as in the reactor 200. Furthermore, the reactor 300 is more advantageous than the reactor 200 for high-aspect-ratio silicon etching because the plasma density and the extent of dissociation in the reactor 300 are lower and more controllable, allowing better control of etch selectivity to the oxide hard mask and the profiles of etched features.

In one embodiment of the present invention, the reactor 300 is controlled by a processor 380 having access to a storage device 381. The processor 380 is coupled to the RF power sources 350 and 370, the match networks 355 and 375, pump 325, the AC current source driving the magnets 330, and the gas supply 340. The storage device 381 includes a computer readable medium storing therein computer readable program instructions that when executed by the processor 380 can cause the RF power source 350 or 370, and/or the magnetic field in the chamber 301 to turn on or off, and up or down. The processor 380 may also control the tuning of the match network 355 or 375 to allow maximum coupling of the RF power from the RF power source 350 or 370, respectively, into the chamber. The processor 380 may also control the gas supply 340 to adjust the flow rate of a gas into the chamber 301 and to switch between different gases, according to the computer readable program instructions.

The process 400 illustrated in FIG. 4 can also be performed in the reactor 300 according to an alternative embodiment of the present invention. In step 410, a flow of the first gas is provided into the vacuum chamber 301. Once the gas pressure in the vacuum chamber 301 is stabilized at a predetermined level, a plasma of the first gas is ignited by turning on either or both of the RF power sources 350 and 370 at step 420. At exactly or approximately the same time, the AC current driving the magnets 330 may also be turned on. Immediately afterwards, the bottom impedance match network 355 and/or the top impedance match network 375 may be tuned to efficiently couple the RF power from the bottom power source 350 and/or the top power source 370, respectively, to the plasma in the vacuum chamber 301. At this point, the etch process has started and is run at step 430 for a first predetermined period of time. During the etch process, RF power is coupled to the plasma using solely or mainly the bottom capacitive coupling means, i.e., the plasma is maintained solely or mainly by RF power from the bottom RF power source 350. As a result, the pedestal 215 is significantly biased with respect to the plasma. In one embodiment of the present invention, during the etch process 430, the bias potential of the pedestal is greater than 100 V, In an alternative embodiment, it is greater than 300 V. The RF power from the top RF power source 370 is either turned off or controlled at a level such that the plasma density is controlled within a desired range, which in one embodiment is $10^{9-10^{11}}$ cm$^{-3}$.

For a 200 mm wafer, the gas pressure in the etch process is in the range of 50–350 mT, and in an exemplary embodiment, is in the range of 100–260 mT. The RF power from the bottom RF source 350 is in the range of 500–3000 W, and in an exemplary embodiment, is in the range of 1200–2200 W; the RF power from the top RF power source 370 is in the range of 0–1000 W, and in an exemplary embodiment, is in the range or 0–600 W; and the magnetic field in the vacuum chamber is in the range of 0–140 G, and in an exemplary embodiment, is in the range of 30–120 G. The flow rate ratios of HBr:He/O$_2$:NF$_3$ are kept at about 5:1:1. In one embodiment of the present invention, the flow of HBr is about 100 sccm, the flow of He/O$_2$ about 20 sccm, and the flow of NF$_3$ about 20 sccm. For a 300 mm wafer, the gas pressure in the etch process is in the range of 50–350 mT, and in an exemplary embodiment, is in the range of 100–260 mT. The RF power from the bottom RF source 350 is in the range of 1000–6000 W and in an exemplary embodiment, is in the range of 2500–4500 W; the RF power from the top RF power source 370 is in the range of 0–2000 W, and in an exemplary embodiment, is in the range of 0–1200 W; and the magnetic field in the vacuum chamber is in the range of 0–140 G, and in an exemplary embodiment, is in the range of 30–120 G. The HBr:He/O$_2$:NF$_3$ flow rate ratios are kept at about 10:1:1. In one embodiment of the present invention, the flow of HBr is about 250 sccm, the flow of He/O$_2$ about 25 sccm, and the flow of NF$_3$ about 25 sccm.

At the end of the first period of time, a decision is made at step 440 on whether enough etching has been done to achieve a desired feature depth. Such a decision is typically based on the desired depth of the features, the etch rate measured on test wafers using the same etch process, the number of etch processes performed and length of time during which each etch process is performed. Once the decision is made that enough etching has been done on the wafer, the process moves to the post etch treatment step 450. On the other hand, if the decision is made that more etching needs to be done, the process 400 proceeds to switch from the etch process to the flash process to strip off a portion of the passivation layer which has built up on the etched feature surface during the pervious etch process. The flash process also cleans the vacuum chamber 301 by removing deposits formed on other surfaces inside the vacuum chamber.

A transition from the etch process to the flash process occurs at step 460. In one embodiment of the present invention, the transition is performed by shutting off the flow of HBr and He/CO$_2$, and increasing the flow of NF$_3$ to a predetermined flow rate for the flash process, as specified below. At approximately the same time, the RF power from the bottom RF power source 350 is turned down while the RF power from the top RF power source 360 is turned up, so that the flash process is performed using a plasma maintained solely or mainly by RF power from the top RF power source 370. The magnetic field in the vacuum chamber 301 may also be turned down or off during the transition because there may no longer be a need for a large magnetic field to raise the plasma density in the presence of the increased amount of RF power from the top RF power source 370.

The flash process is run for a second period of time (flash time). During the flash process, the bottom RF power is either turned off or controlled at a level such that the bias potential of the pedestal 215 is kept low. In one embodiment of the present invention, during the flash process, the pedestal has a DC bias potential that is in the range or 0 to 30 V, and more typically, in the range of 0 to 15 V. For a 200 mm wafer, the gas pressure in the flash process is in the range of 3 mT to 600 mT and in an exemplary embodiment, is in the range of 5–300 mT. The flow of the NF$_3$ gas is in the range of 20 sccm to 200 sccm, and in an exemplary embodiment, is in the range of 30–70 sccm. The RF power from the top RF power source 370 is in the range of 100–3000 W and in an exemplary embodiment, is in the range of 100–600 W. The RF power from the bottom RF source 350 is in the range of 0–500 W, and in an exemplary embodiment, is in the range of 0–50 W, and the magnetic field in the vacuum chamber 301 is in the range of 0–30 G. For a 300 mm wafer, the gas pressure in the flash process is in the range of 3 mT to 600 mT and in an exemplary embodiment, is in the range of 5–300 mT. The flow of the $NF_3$ gas is in the range of 50 sccm to 450 sccm, and in an exemplary embodiment, is in the range of 60–150 sccm. The RF power from the top RF power source 370 is in the range of 100–6000 W and in an exemplary embodiment, is in the range of 200–1500 W. The RF power from the bottom RF source 350 is in the range of 0–1000 W, and in an exemplary embodiment, is in the range of 1–100 W; and the magnetic field in the vacuum chamber 301 is in the range of 0–30 G.

At the end of the second period of time, a transition from the flash process to the etch process occurs at step 480, where the flow of HBr and $He/O_2$ is restarted and the flow of $NF_3$ is decreased. At the same or approximately the same time, the bottom RF power is turned on or up while the top RF power is turned off or down, so that the etch process is performed using solely or mainly bottom capacitive coupling means. The magnetic field in the vacuum chamber 301 may also be turned on or up at the same or approximately the same time. At the completion of the transition, the etch process again starts and is run for a period of time having the same or different length as the first period of time. Steps 430, 440, 460-480 may be run repeatedly in the process 400 until a decision is made at step 440 that enough etching has been performed, and the process 400 proceeds to the post etch treatment step 450.

In the post etch treatment step 450, a transition step similar to step 460 as described above in connection with reactor 300 is used, and a flash process similar to the flash process as described above in connection with reactor 300 is used.

In one embodiment of the present invention, the processor 380 controls the performance of process 400 according to a set of computer executable program instructions stored in the computer readable medium in the storage device 381. The computer executable program instructions, when executed by the processor 380, cause the reactor 300 to perform the etch process or flash process for a predetermined duration of time, to switch between the etch and flash processes at predetermined moments of time during the etching of high-aspect-ratio features, and to perform the post etch treatment step 450 at the end of the etching of high-aspect-ratio features, all in accordance with the process 400, as described above.

The process 400 may also be performed in an ECR reactor where a plasma generated by microwave power is led downstream into an etching chamber and a separate RF power applied across a wafer support pedestal and a wall of the etching chamber controls the energy of the ions impinging on the wafer.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of reducing bromine condensation after exposing a workpiece to a bromine-containing plasma in a process zone for a first period of time, the method comprising:
providing a flow of a gas selected from the group consisting of $NF_3$ and $SF_6$ into the process zone: and
maintaining a plasma of the gas in the process zone for a second period of time.

2. The method of claim 1 wherein a DC voltage between the workpiece and the plasma of the gas during the second period of time is significantly less than a DC voltage between the workpiece and the bromine-containing plasma during the first period of time.

3. A method of operating a reactor to etch high-aspect-ratio patterns on a workpiece, comprising:
performing an etch process comprising:
providing a flow of a first gas into a vacuum chamber; and
maintaining a plasma of the first gas in the vacuum chamber and applying a first substrate bias power during a first period of time, the plasma of the first gas comprising etchant and passivant species;
performing a flash process comprising:
providing a flow of a second gas into the vacuum chamber, the second gas including mainly a deposit removal gas; and
maintaining a plasma of the second gas and applying a second substrate bias power during a second period of time; wherein a DC voltage between the workpiece and the plasma of the second gas during the second period of time is significantly less than a DC voltage between the workpiece and the plasma of the first gas during the first period of time.

4. The method of claim 3 wherein the etch process further comprises applying a slowly rotating magnetic field in the vacuum chamber during the first period of time.

5. The method of claim 3 further comprising repeatedly performing the etch process followed by the flash process on the workpiece.

6. The method of claim 3 wherein the first gas includes hydrogen bromide.

7. The method of claim 3 wherein the first gas includes oxygen.

8. The method of claim 3 wherein the deposit removal gas includes a fluorine based compound selected from the group consisting of $NF_3$, $CF_4$ and $SF_6$.

9. The method of claim 3 wherein the reactor is configured to allow power to be coupled into the vacuum chamber from at least two power supplies.

10. The method of claim 9 wherein the at least two power supplies include a first RF power source capable of maintaining a significant DC voltage between the workpiece and the plasma of the first gas, and a second RF power source capable of maintaining the plasma of the second gas without causing a significant DC voltage to appear between the workpiece and the plasma of the second gas.

11. The method of claim 10 wherein the first RF power source is connected across a bottom electrode under the workpiece and a counter electrode at a ceiling or wall of the vacuum chamber, and a second RF power source is connected to a coil antenna outside the vacuum chamber.

12. The method of claim 11 wherein the coil antenna is over the ceiling of the vacuum chamber and the counter electrode is under the ceiling of the vacuum chamber, and wherein the counter electrode has apertures to allow RF power applied to the coil antenna to be inductively coupled into the vacuum chamber.

13. The method of claim 11 wherein the counter electrode is a gas distribution plate for distributing the first or second gas into the vacuum chamber.

14. The method of claim 10 wherein the first RF power source is connected to a first electrode under the workpiece through a first impedance match network, and a second BE power source is connected to a second electrode at a ceiling or wall of the vacuum chamber through a second impedance match network, and wherein the first RF power source and the second RF power source produce RF power with different frequencies.

15. The method of claim 14 wherein the second electrode is a gas distribution plate for distributing the first or second gas into the vacuum chamber.

16. The method of claim 10 wherein maintaining a plasma of the first gas further comprises:
   coupling RF power from the first RF power supply into the chamber while no RF power is coupled into the chamber from the second RF power supply.

17. The method of claim 10 wherein maintaining a plasma of the first gas further comprises:
   coupling RF power from the first RF power, supply into the chamber; and
   coupling RF power from the second RF power supply into the chamber; wherein the RF power coupled into the chamber from the first RF power supply is substantially greater than the RF power coupled into the chamber from the second RF power supply.

18. The method of claim 10 wherein maintaining a plasma of the second gas further comprises:
   coupling RF power from the second RF power supply into the chamber while no RF power is coupled into the chamber from the first RF power supply.

19. The method of claim 10 wherein maintaining a plasma of the second gas further comprises:
   coupling RF power from the second RF power supply into the chamber; and
   coupling RF power from the first RF power supply into the chamber; wherein the RF power coupled into the chamber from the second RF power supply is substantially greater than the RF power coupled into the chamber from the first RF power supply.

* * * * *

UNITED STATES PATENT AND TRADEMARK OFFICE
CERTIFICATE OF CORRECTION

PATENT NO. : 6,897,155 B2
DATED : May 24, 2005
INVENTOR(S) : Ajay Kumar et al.

It is certified that error appears in the above-identified patent and that said Letters Patent is hereby corrected as shown below:

Column 7,
Line 12, delete "$10^{9-1011}$" and insert -- $10^9$-$10^{11}$ --.

Column 11,
Line 54, delete "$10^{9-1011}$" and insert -- $10^9$-$10^{11}$ --.

Column 12,
Line 35, delete "$He/CO_2$" and insert -- $He/O_2$ --.

Column 13,
Line 63, after "zone" delete ":" and insert -- ; --.

Column 14,
Line 62, delete "BE" and insert -- RF --.

Column 15,
Line 11, after "power" delete ",".

Signed and Sealed this

Fourteenth Day of February, 2006

JON W. DUDAS
*Director of the United States Patent and Trademark Office*